United States Patent
Lin

(10) Patent No.: US 9,929,050 B2
(45) Date of Patent: Mar. 27, 2018

(54) MECHANISMS FOR FORMING THREE-DIMENSIONAL INTEGRATED CIRCUIT (3DIC) STACKING STRUCTURE

(71) Applicant: TAIWAN SEMICONDUCTOR MANUFACTURING CO., LTD., Hsin-Chu (TW)

(72) Inventor: Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/943,245

(22) Filed: Jul. 16, 2013

(65) Prior Publication Data

US 2015/0021771 A1    Jan. 22, 2015

(51) Int. Cl.
*H01L 21/768* (2006.01)
*H01L 23/48* (2006.01)
(Continued)

(52) U.S. Cl.
CPC ...... *H01L 21/76898* (2013.01); *H01L 23/481* (2013.01); *H01L 23/5329* (2013.01); *H01L 23/53238* (2013.01); *H01L 24/80* (2013.01); *H01L 24/94* (2013.01); *H01L 25/0657* (2013.01); *H01L 25/50* (2013.01); *H01L 27/0688* (2013.01); *H01L 21/76849* (2013.01); *H01L 2224/08147* (2013.01); *H01L 2224/80013* (2013.01); *H01L 2224/80075* (2013.01); *H01L 2224/80091* (2013.01); *H01L 2224/80095* (2013.01); *H01L 2224/80896* (2013.01); *H01L 2224/9202* (2013.01); *H01L 2224/94* (2013.01);
(Continued)

(58) Field of Classification Search
CPC ... H01L 24/81; H01L 23/49811; H01L 25/50; H01L 21/76877; H01L 23/5226; H01L 24/19; H01L 23/53238; H01L 24/05; H01L 21/4853; H01L 21/486; H01L 21/76898; H01L 23/481; H01L 25/0657; H01L 21/20; H01L 27/146
See application file for complete search history.

(56) References Cited

U.S. PATENT DOCUMENTS 5,547,906 A    8/1996    Badehi
5,952,725 A    9/1999    Ball
(Continued)

*Primary Examiner* — Marc Armand
*Assistant Examiner* — Quinton Brasfield
(74) *Attorney, Agent, or Firm* — Slater Matsil, LLP

(57) ABSTRACT

Embodiments of mechanisms of forming a semiconductor device are provided. The semiconductor device includes a first semiconductor wafer comprising a first transistor formed in a front-side of the first semiconductor wafer. The semiconductor device also includes a second semiconductor wafer comprising a second transistor formed in a front-side of the second semiconductor wafer, and a backside of the second semiconductor wafer is bonded to the front-side of the first semiconductor wafer. The semiconductor device further includes an first interconnect structure formed between the first semiconductor wafer and the second semiconductor wafer, and the first interconnect structure comprises a first cap metal layer formed over a first conductive feature. The first interconnect structure is electrically connected to first transistor, and the first cap metal layer is configured to prevent diffusion and cracking of the first conductive feature.

18 Claims, 9 Drawing Sheets

(51) Int. Cl.
  *H01L 23/532* (2006.01)
  *H01L 25/065* (2006.01)
  *H01L 23/00* (2006.01)
  *H01L 25/00* (2006.01)
  *H01L 27/06* (2006.01)

(52) U.S. Cl.
  CPC ............ *H01L 2225/06524* (2013.01); *H01L 2225/06541* (2013.01); *H01L 2225/06565* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10333* (2013.01); *H01L 2924/10335* (2013.01); *H01L 2924/10338* (2013.01); *H01L 2924/10342* (2013.01)

(56) References Cited

U.S. PATENT DOCUMENTS

| | | |
|---|---|---|
| 6,448,661 B1 | 9/2002 | Kim et al. |
| 7,354,798 B2 | 4/2008 | Pogge et al. |
| 7,791,175 B2 | 9/2010 | Pyeon |
| 7,825,024 B2 | 11/2010 | Lin et al. |
| 7,898,095 B2 | 3/2011 | Patti et al. |
| 7,906,363 B2 | 3/2011 | Koyanagi |
| 7,943,428 B2 * | 5/2011 | Gambino ............... H01L 21/48 483/118 |
| 8,421,193 B2 | 4/2013 | Huang |
| 8,563,403 B1 | 10/2013 | Farooq et al. |
| 8,729,711 B2 | 5/2014 | Nishio |
| 8,860,229 B1 | 10/2014 | Lin |
| 9,087,821 B2 | 7/2015 | Lin |
| 9,293,437 B2 | 3/2016 | Yu et al. |
| 2002/0098681 A1 * | 7/2002 | Hu ........................ H01L 21/288 438/626 |
| 2005/0156278 A1 * | 7/2005 | Coolbaugh .......... H01L 21/7687 257/532 |
| 2007/0224776 A1 * | 9/2007 | Chiou ............... H01L 21/76898 438/455 |
| 2007/0269978 A1 * | 11/2007 | Shih .................. H01L 21/02074 438/643 |
| 2010/0047963 A1 | 2/2010 | Wang et al. |
| 2010/0096760 A1 | 4/2010 | Yu et al. |
| 2010/0178761 A1 | 7/2010 | Chen et al. |
| 2010/0264551 A1 * | 10/2010 | Farooq ............. H01L 21/76898 257/777 |
| 2010/0320575 A9 * | 12/2010 | Chauhan ............... H01L 23/481 438/613 |
| 2011/0050320 A1 | 3/2011 | Gillingham |
| 2011/0108972 A1 | 5/2011 | Foster, Sr. et al. |
| 2011/0193240 A1 | 8/2011 | Farooq et al. |
| 2011/0248396 A1 | 10/2011 | Liu et al. |
| 2012/0018885 A1 | 1/2012 | Lee et al. |
| 2012/0193785 A1 | 8/2012 | Lin et al. |
| 2012/0292784 A1 * | 11/2012 | Nishio ................ H01L 21/3221 257/774 |
| 2013/0020468 A1 * | 1/2013 | Mitsuhashi ....... H01L 27/14623 257/773 |
| 2013/0020719 A1 | 1/2013 | Jung et al. |
| 2013/0169355 A1 * | 7/2013 | Chen ....................... H01L 23/60 327/564 |
| 2014/0117546 A1 | 5/2014 | Liu et al. |
| 2014/0151895 A1 | 6/2014 | West et al. |
| 2014/0264840 A1 | 9/2014 | Lin et al. |
| 2014/0353828 A1 | 12/2014 | Edelstein et al. |
| 2015/0145144 A1 | 5/2015 | McDonald |

* cited by examiner

MECHANISMS FOR FORMING THREE-DIMENSIONAL INTEGRATED CIRCUIT (3DIC) STACKING STRUCTURE

CROSS REFERENCE TO RELATED APPLICATIONS

This application is related to the following co-pending an commonly assigned patent applications: U.S. application Ser. No. 13/943,157, filed on Jul. 16, 2013 and entitled "Front-to-back bonding with through-substrate via (TSV)", and U.S. application Ser. No. 13/943,224, filed on Jul. 16, 2013 and entitled "Hybrid bonding with through substrate via (TSV)", U.S. application Ser. No. 14/752,342, filed on Jun. 26, 2015 and entitled "Hybrid bonding with through substrate via (TSV)", U.S. application Ser. No. 13/943,401, filed on Jul. 16, 2013 and entitled "Hybrid bonding with through substrate via (TSV)", and U.S. application Ser. No. 14/488,017, filed on Sep. 16, 2014 and entitled "Hybrid bonding with through substrate via (TSV)".

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Figure 1A:
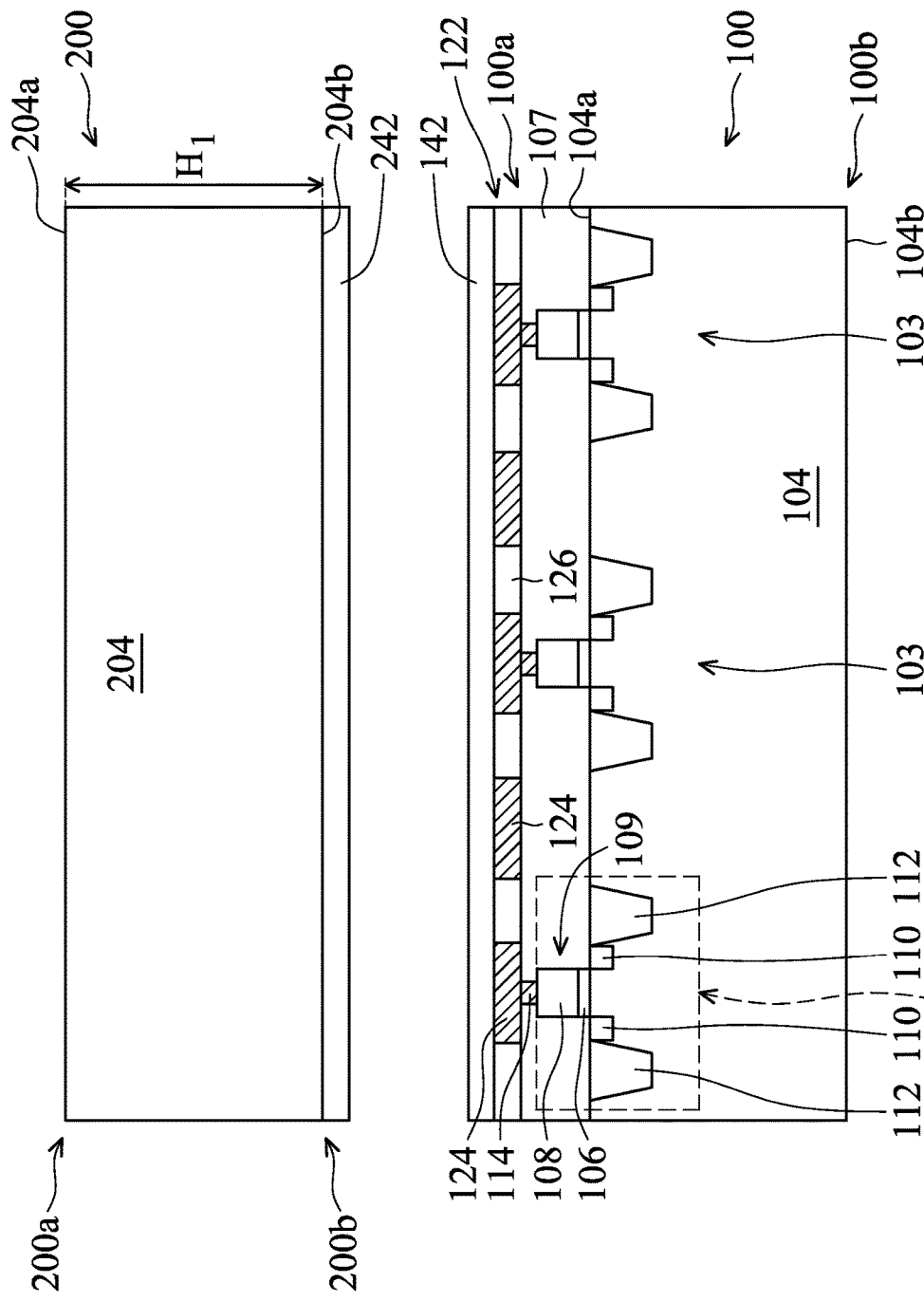
FIGS. 1A-1E show cross-sectional representations of various stages of fabricating a stacking structure in accordance with some embodiments of the disclosure.

FIGS. 1A-1E show cross-sectional representations of various stages of forming a semiconductor device in accordance with some embodiments of the disclosure. Referring to FIG. 1A, a cross-sectional representation of a portion of a semiconductor wafer 100 and a portion of another semiconductor wafer 200 are shown in accordance with some embodiments.

Semiconductor wafer 100 includes a semiconductor substrate 104, which is made of silicon or other semiconductor materials, and has a top surface 104a and a bottom surface 104b in accordance with some embodiments of the disclosure. Alternatively or additionally, semiconductor substrate 104 may include other elementary semiconductor materials such as germanium. In some embodiments, semiconductor substrate 104 is made of a compound semiconductor, such as silicon carbide, gallium arsenic, indium arsenide, or indium phosphide. In some embodiments, semiconductor substrate 104 is made of an alloy semiconductor such as silicon germanium, silicon germanium carbide, gallium arsenic phosphide, or gallium indium phosphide. In some embodiments, semiconductor substrate 104 includes an epitaxial layer. For example, semiconductor substrate 104 has an epitaxial layer overlying a bulk semiconductor.

Referring to FIG. 1A, device regions 103 are formed in a front-side 100a of semiconductor wafer 100 in a front-end-of-line (FEOL) process in accordance with some embodiments of the disclosure. Each device region 103 includes a gate structure 109 embedded in a dielectric layer 107, source/drain regions 110, and isolation structures 112, such as shallow trench isolation (STI) structures. Gate structure 109 includes a gate dielectric layer 106, a gate electrode 108, and spacers (not shown). Device regions 103 shown in FIG. 1 are merely examples, and other devices may be formed in device regions 103.

Device regions 103 may form various N-type metal-oxide semiconductor (NMOS) and/or P-type metal-oxide semiconductor (PMOS) devices, such as transistors or memories, and the like, interconnected to perform one or more functions. Other devices, such as capacitors, resistors, diodes, photo-diodes, fuses, and the like may also be formed in substrate 104. The functions of the devices may include memory, processing, sensor, amplifier, power distribution, input/output circuitry, or the like. In some embodiments, device regions 103 are NMOS and/or PMOS transistors.

An interconnect structure 122 is formed over substrate 104, e.g., over device regions 103. In some embodiments, interconnect structure 122 includes a contact plug 114 and conductive features 124. Conductive features 124 are embedded in an insulating material 126. Interconnect structure 122 is formed in a back-end-of-line (BEOL) process in some embodiments. In some embodiments, contact plug 114 is made of conductive materials, such as copper (Cu), copper alloy, aluminum (Al), aluminum alloys, or combinations thereof. Conductive features 124 are also made of conductive materials, such as copper, copper alloy, aluminum, aluminum alloys, or combinations thereof. Alternatively, other applicable materials may be used. In some embodiments, conductive features 124 include multi-layers made of various materials, such as a plurality of metallization structures.

In some embodiments, insulating material 126 is made of silicon oxide. In some embodiments, insulating material 126 includes multiple dielectric layers of dielectric materials. In some embodiments, a top dielectric layer of the multiple dielectric layers is made of $SiO_2$. Interconnect structure 122 shown is merely for illustrative purposes. Interconnect structure 122 may include other configurations and may include one or more conductive lines and via layers.

A bonding layer 142, which is a dielectric layer, is formed over interconnect structure 122. Bonding layer 142 is made of a silicon-containing dielectric, such as silicon oxide, silicon oxynitride or silane oxide.

In some embodiments, bonding layer 142 is formed by plasma enhanced chemical vapor deposition (PECVD). In some other embodiments, bonding layer 142 is formed by a spin-on method. In some embodiments, bonding layer 142 has a thickness in a range from about 5 nm to about 800 nm.

As shown in FIG. 1A, devices, such as transistor including gate structure 109, are formed in front-side 100a of semiconductor wafer 100, while no devices are formed in a backside 100b of semiconductor wafer 100. In addition, the transistor including gate structure 109 is electrically connected to interconnect structure 122.

Semiconductor wafer 200 includes a substrate 204, which is similar to substrate 104. Substrate 204 has a top surface 204a and a bottom surface 204b. A bonding layer 242, which is a dielectric layer, is formed on bottom surface 204b of substrate 204. Bonding layer 242 is similar to bonding layer 142. No devices are pre-formed in semiconductor wafer 200.

As shown in FIG. 1A, semiconductor wafer 200 has a height $H_1$ from top surface 204a to bottom surface 204b of substrate 204 of semiconductor wafer 200 in a range from about 50 μm to about 775 μm.

Before semiconductor wafers 100 and 200 are bonded together, surfaces of bonding layers 142 and 242 are treated to improve the bonding. Bonding layers 142 and 242 are treated by a dry treatment or a wet treatment. The dry treatment includes a plasma treatment. In some embodiments, the plasma treatment is performed in an inert environment, such as an environment filled with inert gas including $N_2$, Ar, He, or combinations thereof. Alternatively, other types of treatments may be used. In some embodiments, both of bonding layers 142 and 242 are made of silicon oxide, and a plasma process is performed to bonding layers 142 and 242 to form Si—OH bonds on the surface of bonding layers 142 and 242 prior to bonding.

Figure 1B:
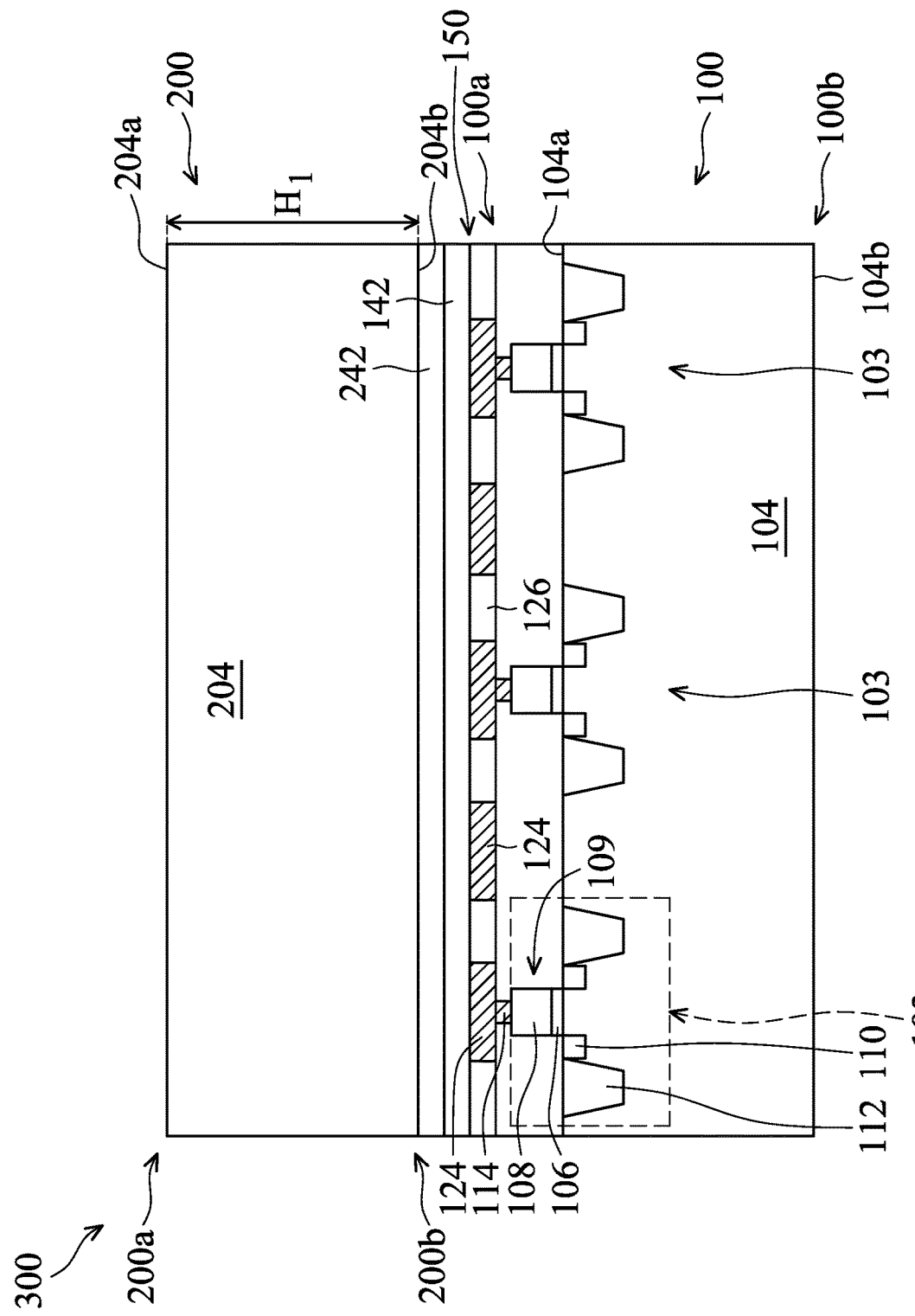

Referring to FIG. 1B, semiconductor wafer 100 is boned to semiconductor wafer 200 by bonding dielectric layers 142 and 242 to form a 3DIC stacking structure (die stack) 300 in accordance with some embodiments of the disclosure. As shown in FIG. 1B, when semiconductor wafer 200 is bonded to semiconductor wafer 100, bottom surface 204b of substrate 204 faces top surface 104a of substrate 104. Bonding of bonding layers 142 and 242 of semiconductor wafers 100 and 200 is performed under pressure and heat. In some embodiments, the pressure for bonding is in a range from about 0.7 bar to about 10 bar. In some embodiments, an anneal operation is applied to bond semiconductor wafers 100 and 200 at a temperature in a range from about 20° C. to about 1000° C. The bonding process may be performed in an inert environment, such as an environment containing $N_2$, Ar, He, or combinations thereof.

As shown in FIG. 1B, stacking structure 300 includes a bonding structure 150. Bonding structure 150 includes bonding layers 142 and 242 bonded together. Therefore, backside 200b of semiconductor wafer 200 is bonded to front-side 100a of semiconductor wafer 100. If some devices are formed in semiconductor wafer 200 before bonding, semiconductor wafers 100 and 200 have to be precisely aligned before bonding. In contrast, since no devices are pre-formed in semiconductor wafer 200, alignment is not required for bonding of semiconductor wafers 100 and 200.

Figure 1C:
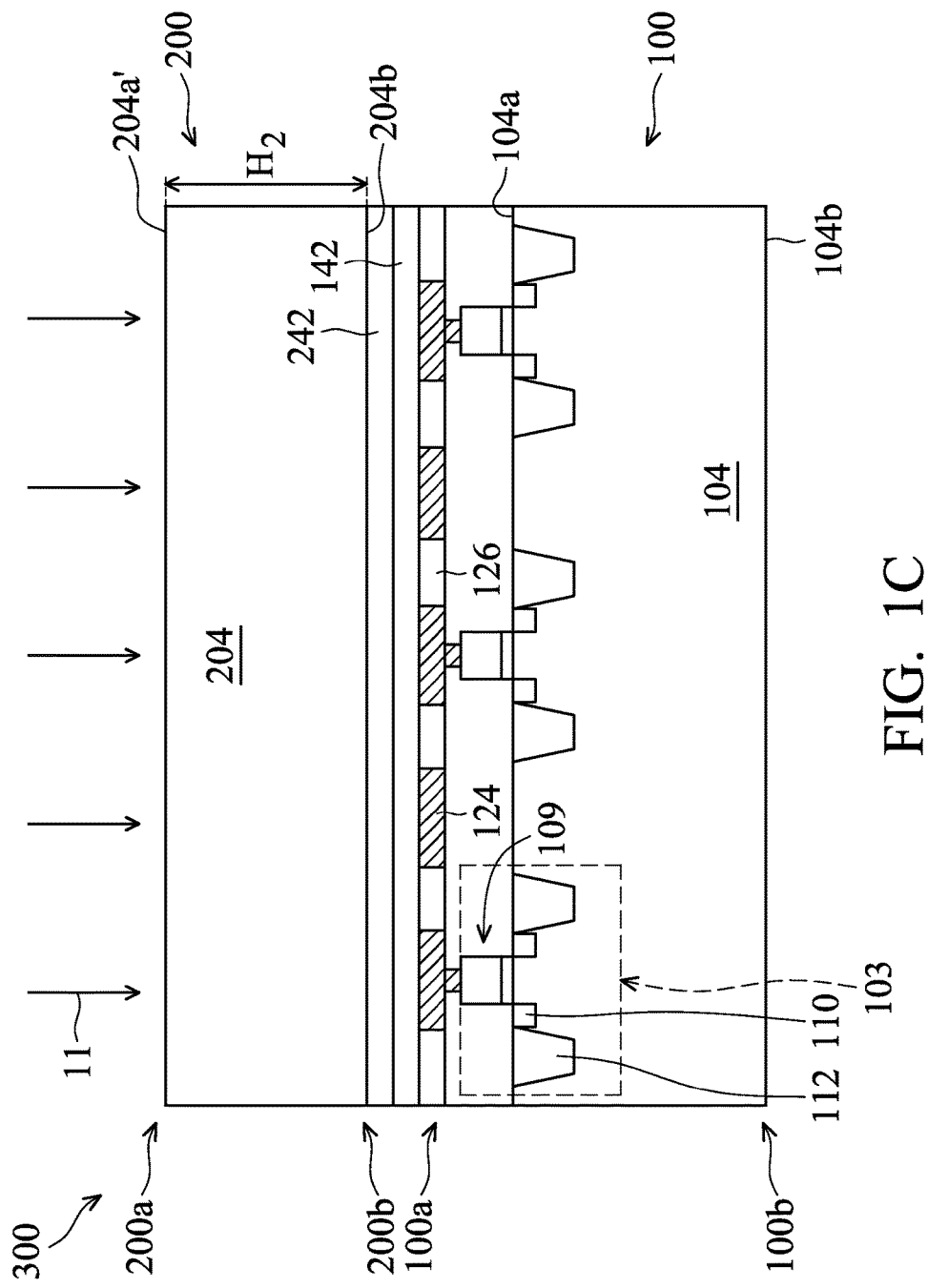

After the bonding of semiconductor wafers 100 and 200, a thinning process 11 is performed on top surface 204a of substrate 204 in accordance with some embodiments of the disclosure, referring to FIG. 1C. Thinning process 11 may include a grinding operation and a polishing operation, such as chemical mechanical polishing (CMP). After thinning process 11, a wet etching operation is performed to remove the defects formed on top surface 204a of substrate 204. In some embodiments, after thinning process 11, semiconductor wafer 200 has a height $H_2$ from top surface 204a' to bottom surface 204b of substrate 204 of semiconductor wafer 200 in a range from about 0.2 μm to about 10 μm. Height $H_2$ is smaller than height $H_1$. In some embodiments, a ratio of height $H_2$ to height $H_1$ is in a range from about 0.0002 to about 0.99. After thinning semiconductor wafer 200, device regions 203 are formed in semiconductor wafer 200 in accordance with some embodiments of the disclosure, referring to FIG. 1D. Device regions 203 are formed in a front-side 200a of semiconductor wafer 200 in a front-end-of-line (FEOL) process in some embodiments. Each device regions 203 includes a gate structure 209 embedded in a dielectric layer 207, source/drain regions 210, and isolation structures 212, such as shallow trench isolation (STI) structures. Gate structure 209 includes a gate dielectric layer 206, a gate electrode 208, and spacers (not shown). A contact plug 2142 is formed over device regions 203.

Figure 1D:
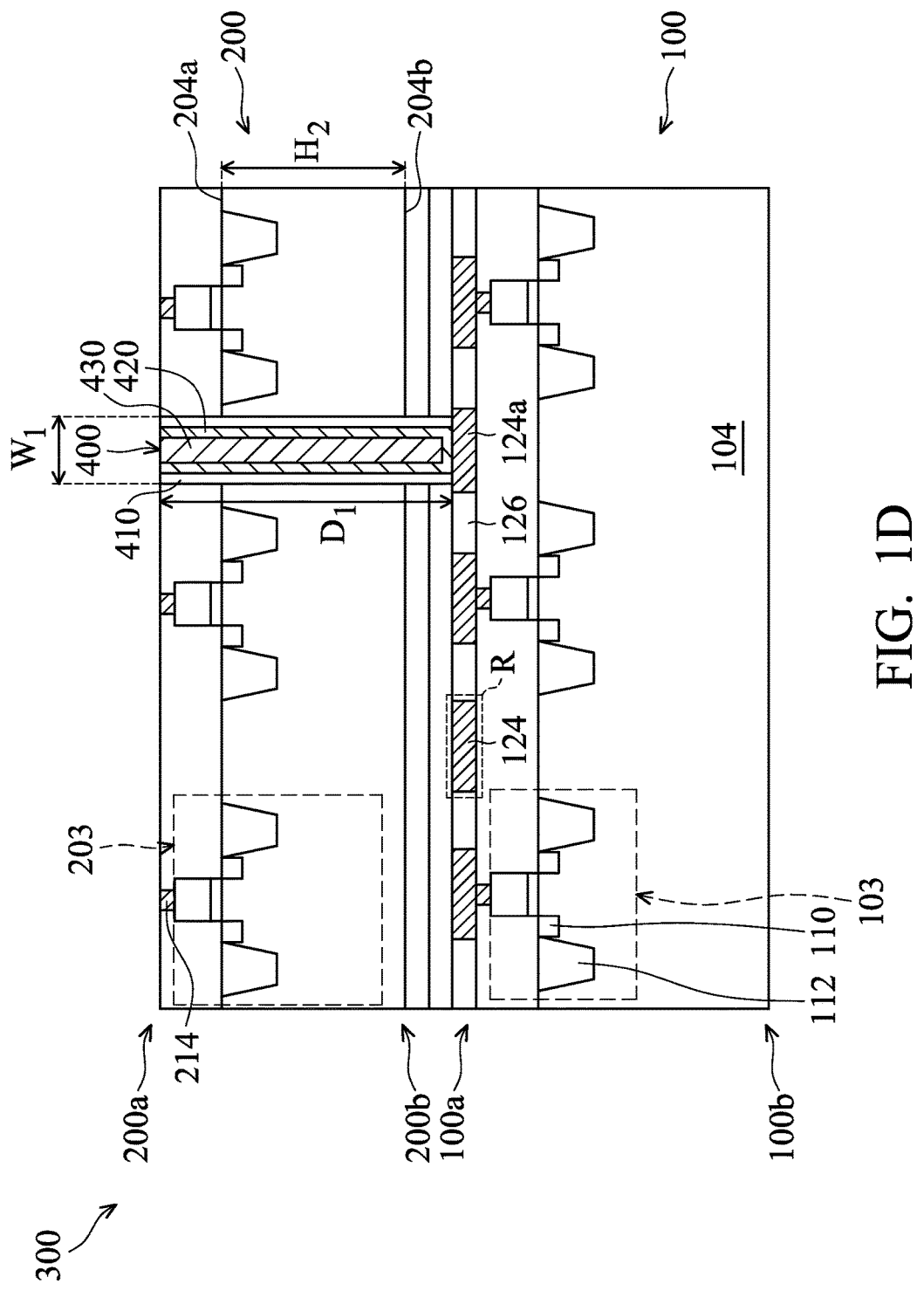

As shown in FIG. 1D, devices, such as transistors including gate structure 209, are formed in front-side 200a of semiconductor wafer 200, while no devices are formed in backside 200b of semiconductor wafer 200. In addition, backside 200b of semiconductor wafer 200 is bonded to front side 100a of semiconductor wafer 100, and therefore the resulting stacking structure is a front-to-back (face-to-back) stacking structure.

After device regions 203 are formed, through-substrate via (TSV) 400 is formed through second semiconductor wafer 200. Through-substrate via (TSV) 400 is used to provide electrical connections and for heat dissipation for 3DIC stacking structures. In some embodiments, TSV 400 is electrically connected to conductive feature 124a. Although FIG. 1D only shows one TSV, more than one TSV may be formed to pass through second semiconductor wafer 200.

TSV 400 includes a liner 410, a diffusion barrier layer 420, and a conductive material 430, in accordance with some embodiments. Liner 410 is made of an insulating material, such as oxides or nitrides. Liner 410 may be formed by using a plasma enhanced chemical vapor deposition (PECVD) process or other applicable processes. In some embodiments, diffusion barrier layer 420 is made of Ta, TaN, Ti, TiN, or CoW. In some embodiments, diffusion barrier layer 420 is formed by a physically vapor deposition (PVD) process or atomic layer deposition (ALD) process. In some embodiments, conductive material 430 is made of copper, copper alloy, aluminum, aluminum alloys, or combinations thereof. In some embodiments, conductive material 430 is formed by plating.

As shown in FIG. 1D, since the height of substrate 204 is reduced from $H_1$ to $H_2$, aspect ratio of TSV 400 is reduced. Therefore, the void problems and the extrusion or diffusion problems resulting from a high aspect ratio of the TSV are resolved or greatly reduced. In addition, the overall package height of 3DIC stacking structure 300 is reduced to meet advanced packaging requirements. Therefore, 3DIC stacking structure 300 achieves small form factor.

In some embodiments, TSV 400 has a width $W_1$ in a range from about 0.025 μm to about 4 μm. In some embodiments, TSV 400 has a depth $D_1$ in a range from about 0.2 μm to about 10 μm. In some embodiments, TSV 400 has an aspect ratio ($D_1/W_1$) in a range from about 2 to about 15.

Figure 1E:
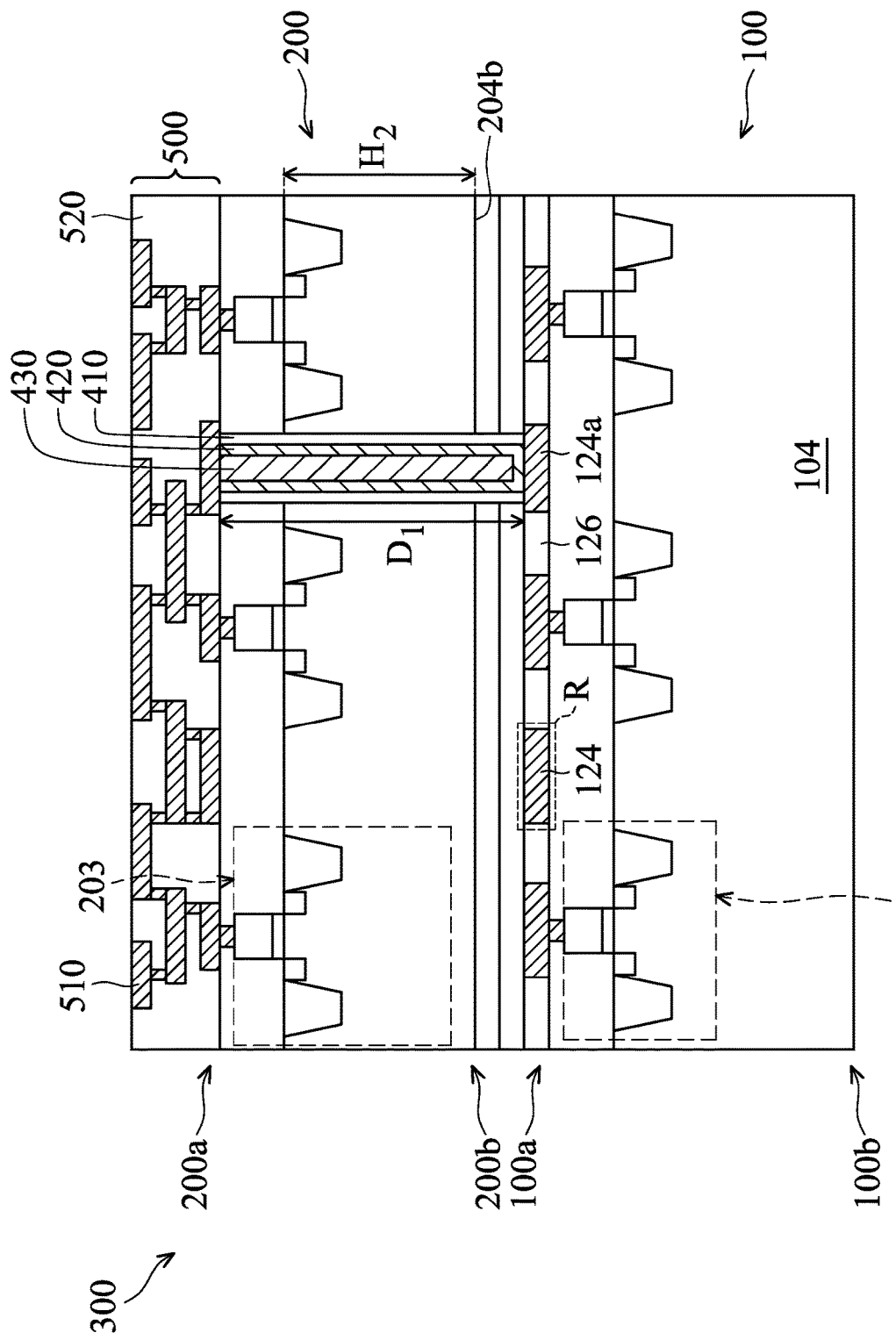
Figure 1F:
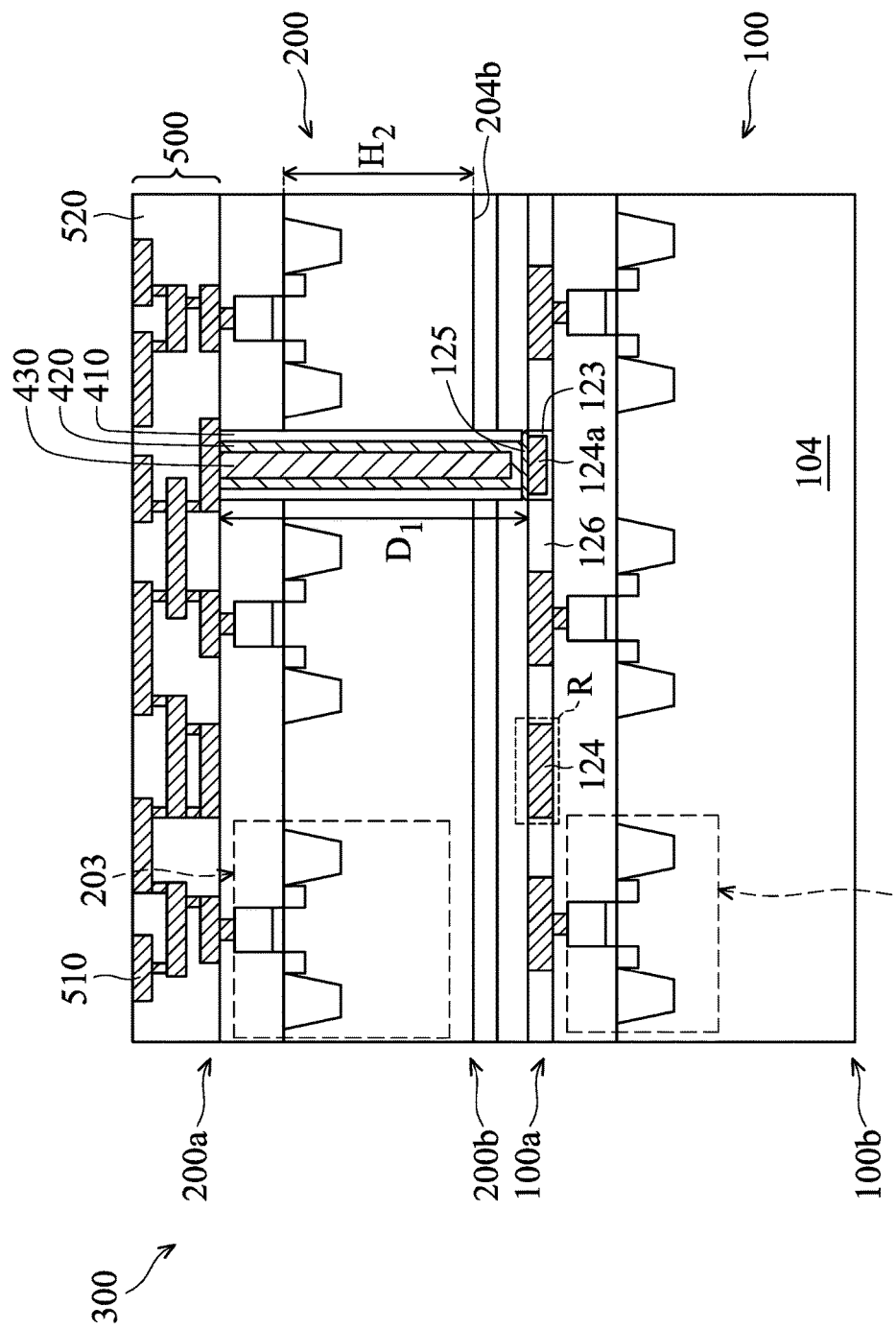
FIG. 1F show a cross-sectional representation of a TSV directly contacts with a first cap metal layer.

After TSV 400 is formed, an interconnect structure 500 is formed on front-side 200a of second semiconductor wafer 200 in accordance with some embodiments, referring to FIG. 1E. Interconnect structure 500 is electrically connected to conductive features 124a of semiconductor wafer 100 via TSV 400. Interconnect structure 500 includes conductive features 510, such as conductive lines, vias, or conductive pads, formed in an insulating material 520. The metal routings of the conductive features shown in FIG. 1E, are merely examples. Alternatively, other designs of metal routings of conductive features may be used according to actual application. In addition, other processes may also be performed to 3DIC stacking structure 300, and 3DIC stacking structure 300 may be diced to form individual chips afterwards. Referring to FIG. 1F, the TSV 400 directly contacts with a first cap metal layer 125 which is formed over the conductive features 124a.

Figure 2:
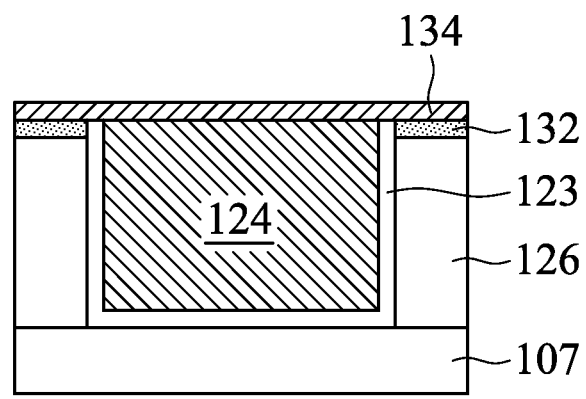
FIG. 2 shows an enlarged cross-sectional representation of region R in FIG. 1D in accordance with some embodiments of the disclosure.

FIG. 2 shows an enlarged cross-sectional representation of region R in FIG. 1D in accordance with some embodiments of the disclosure. Region R shows a portion of conductive feature 124. A stop layer 132 is formed over insulating material 126. Conductive feature 124 is formed in insulating material 126, and it is surrounded by a diffusion barrier layer 123. Diffusion barrier layer 123 may be made of titanium (Ti), titanium nitride (TiN), tantalum (Ta), tantalum nitride (TaN), or aluminum nitride (AlN). For example, conductive feature 124 is made of copper, and diffusion barrier layer 123 includes TaN/Ta bi-layer.

In order to eliminate or reduce migration and diffusion of metal of conductive feature 124 into adjacent insulating material 126, a dielectric capping layer 134 is formed over conductive feature 124. In addition, dielectric capping layer 134 is also located over diffusion barrier layer 123, stop layer 132, and insulating material 126. In some embodiments, dielectric capping layer 134 and stop layer 132 are respectively made of dielectric layer, such as silicon nitride (e.g., SiN), silicon oxynitride (e.g., SiON), silicon carbide (e.g., SiC), silicon oxycarbide (e.g., SiOC or SiCO), or silicon carbide nitride (e.g., SiCN). It will be appreciated that the stoichiometry of the respective dielectric layers may be varied according to chemical vapor deposition (CVD) processing variables, including the altering of relative ratios of reactants to achieve a desired compressive stress of the film. Materials of dielectric capping layer 134 may be the same or similar to that of stop layer 132. For example, dielectric capping layer 134 and stop layer 132 are both made of silicon nitride. However, since the material of dielectric capping layer 134 is rigid, some cracks would be formed in dielectric capping layer 134 under high temperature. In addition, the difference of thermal expansions between dielectric capping layer 134 and conductive feature 124 would also lead to the formation of cracks during high temperature processes. Such cracks results in reducing of reliability, and yield is therefore reduced.

As described previously, devices, such as transistors in device regions 203, are formed in front-side 200a of semiconductor wafer 200, and some fabricating processes for the devices are performed in high temperature operation, such as a rapid thermal process (RTP). For example, the temperature is in a range from about 500° C. to about 1200° C. Therefore, dielectric capping layer 134 is damaged during the high temperature fabrication process.

In order to solve the cracking problem, a cap metal layer 125 is formed over conductive feature 124 to replace dielectric capping layer 134. In some embodiments, cap metal layer 125 is made of Ni, NiB, NiWB, Co, CoWB, CoWP, or NiReP. Since cap metal layer 125 is made of a relatively soft material and the difference of thermal expansions between cap metal layer 125 and conductive feature 124 is relatively small, cracks are not formed on cap metal layer 125.

Figure 3A:
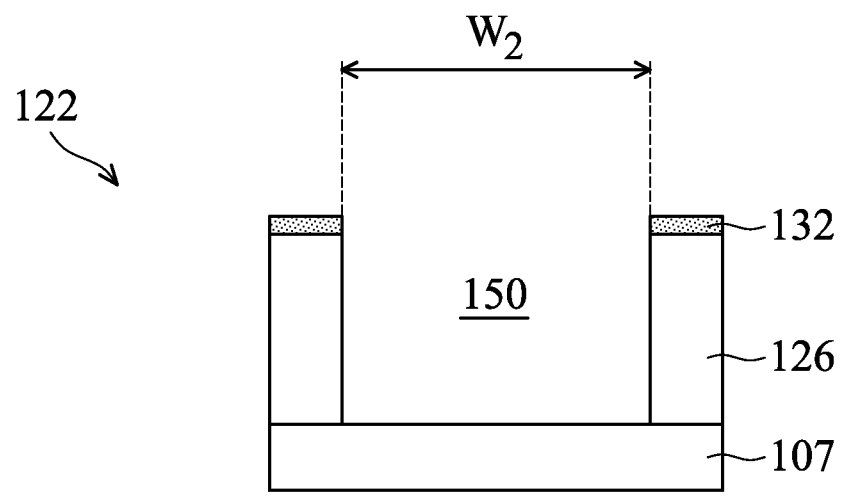
FIGS. 3A-3D show cross-sectional representations of various stages of forming an interconnect structure in accordance with some embodiments of the disclosure.

FIGS. 3A-3D show cross-sectional representations of various stages of forming interconnect structure 122 in accordance with some embodiments of the disclosure. Referring to FIG. 3A, interconnect structure 122 includes a single damascene structure used as a first metallization layer M1 (shown in FIG. 3D) in accordance with some embodiments of the disclosure. First metallization layer M1 includes stop layer 132 formed over insulating layer 126 (such as inter-metal dielectric, IMD) and dielectric layer 107. An opening 150 is formed in insulating layer 126 to expose a portion of dielectric layer 107. It is noted that opening 150 is connected to contact plug 114 although it is not shown in FIG. 3A. In some embodiments, opening 150 has a width $W_2$ in 0.03 μm to about 5 μm. Insulating layer 126 and dielectric layer 107 are described above and detail description are not repeated again for brevity.

Figure 3B:
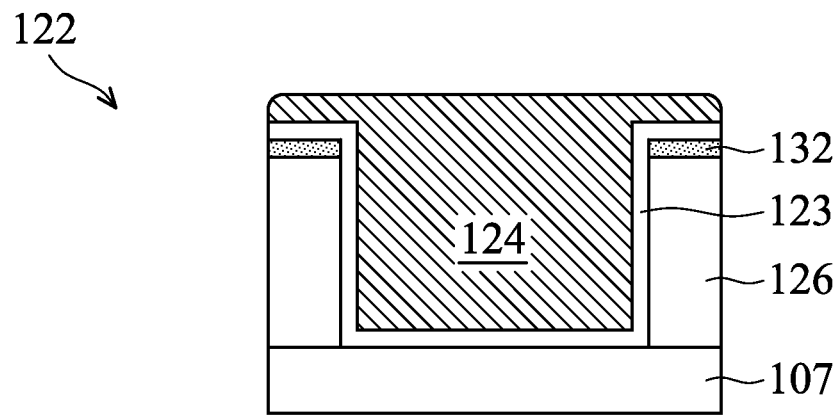

In some embodiments, if the metal (such as copper) of conductive feature 124 formed later is easy to diffuse, a diffusion barrier layer 123 is needed. Referring to FIG. 3B, a diffusion barrier layer 123 is formed on the sidewalls and the bottom of opening 150 in accordance with some embodiments of the disclosure. After forming diffusion barrier layer 123, conductive feature 124 is used to fill opening 150. Conductive feature 124 is described above and detail descriptions are not repeated again for brevity. Conductive feature 124 is surrounded by diffusion barrier layer 123.

Figure 3C:
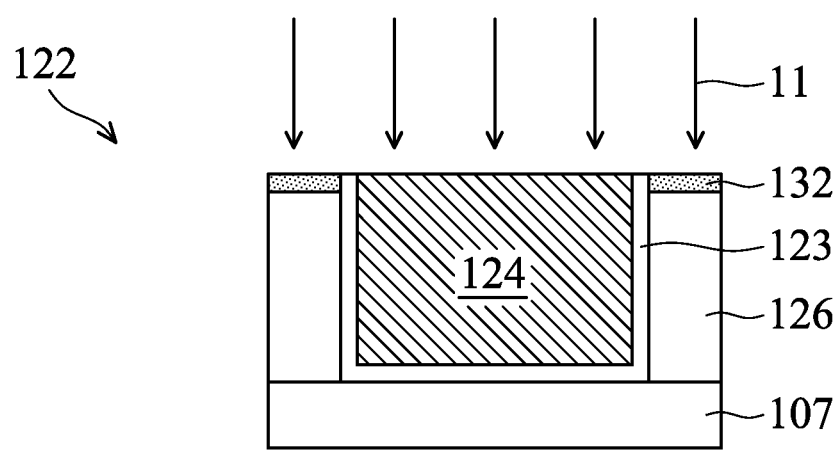

Referring to FIG. 3C, a chemical mechanical polishing (CMP) process 11 is performed to remove the excess portion of diffusion barrier layer 123 and conductive feature 124 outside of opening 150 after conductive feature 124 is formed, in accordance with some embodiments of the disclosure.

Figure 3D:
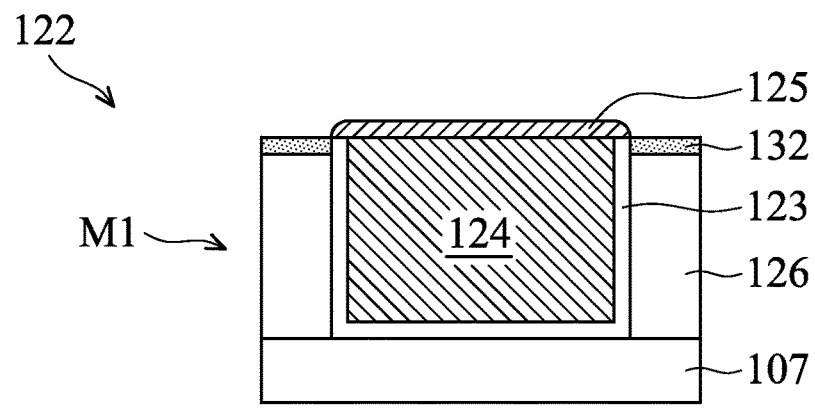

Referring to FIG. 3D, a cap metal layer 125 is formed on conductive feature 124 and diffusion barrier layer 123 to prevent metal diffusion of conductive feature 124, in accordance with some embodiments of the disclosure. In addition, cap metal layer 125 is used to replace dielectric capping layer 134 (shown in FIG. 2) to avoid the crack. In some embodiments, cap metal layer 125 is formed by an electroless method. Therefore, cap metal layer 125 is self-aligned over conductive feature 124 by the electroless method without using a tedious photolithography process. In some embodiments, cap metal layer 125 has a thickness in a range from about 5 Å to about 700 Å.

A portion of dielectric capping layer 134 must to be removed to expose conductive feature 124 in order to connect another metallization layer (not shown). In contrast, cap metal layer 125 shown in FIG. 3D is conductive. Another metallization layer (not shown) may be directly formed over cap metal layer 125 without excessive etching process.

Figure 4:
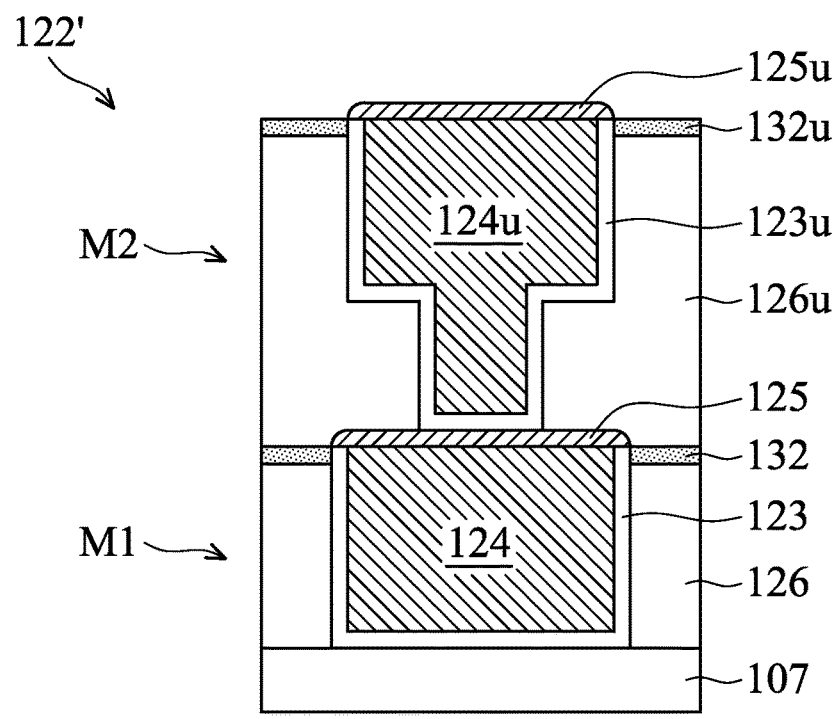
FIG. 4 show a cross-sectional representation of an interconnect structure in accordance with some embodiments of the disclosure.

FIG. 4 shows a cross-sectional representation of an interconnect structure 122' in accordance with some embodiments of the disclosure. Interconnect structure 122' includes a dual damascene structure having a second metallization layer M2 formed over a first metallization layer M1. Second metallization layer M2 is formed by the following operations. An insulating layer 126u is formed over first metallization layer M1. A dual damascene opening includes an upper trench section and a lower via-hole section formed in insulating layer 126u. A diffusion barrier layer 123u is formed to line the sidewalls and the bottom of the dual damascene opening. Afterwards, conductive feature 124u is filled into the dual damascene opening. After conductive feature 124u is formed, a chemical mechanical polishing (CMP) process is performed to remove the excess portion of diffusion barrier layer 123u and conductive feature 124u outside of the dual damascene opening.

Cap metal layer 125u is used to reduce migration and diffusion of metal of conductive feature 124u into the adjacent insulating material 126u. In addition, cap metal layer 125u is formed on conductive feature 124u and diffusion barrier layer 123u to avoid cracking. As shown in FIG. 4, interconnect structure 122' includes lower conductive feature 124 and upper conductive feature 124u formed over lower conductive feature 124. In addition, lower metal cap layer 125 is formed between lower conductive feature 124 and upper conductive feature 124u, and upper metal cap layer 125u is formed on upper metal cap layer 125u. Since cap metal layer 125b is conductive, a third metallization layer (not shown) may be directly formed over cap metal layer 125b. In addition, interconnect structure 122' may further include a number of metallization layers Mn (n is an positive integral) depending on applications.

In some embodiments, metal cap layer 125 is formed between conductive feature 124a and TSV 400 shown in FIG. 1E. Therefore, TSV 400 may extend from the front-side of semiconductor 200 to cap metal layer 125 on conductive feature 124a and electrically connects conductive features 510 in interconnect structure 150 and conductive feature 124a, as shown in FIG. 1E.

Embodiments of mechanisms for forming a semiconductor device structure are provided. A front-side of a first semiconductor wafer is bonded to a backside of a second semiconductor wafer to form a front-to-back (face-to-back) stacking structure. An interconnect structure formed between the first semiconductor wafer and the second semiconductor wafer includes a cap metal layer to prevent metal diffusion and reduce cracking.

In some embodiments, a semiconductor device is provided. The semiconductor device includes a first semiconductor wafer comprising a first transistor formed in a front-side of the first semiconductor wafer. The semiconductor device also includes a second semiconductor wafer comprising a second transistor formed in a front-side of the second semiconductor wafer, and a backside of the second semiconductor wafer is bonded to the front-side of the first semiconductor wafer. The semiconductor device further includes a first interconnect structure formed between the first semiconductor wafer and the second semiconductor wafer, and the first interconnect structure comprises a cap metal layer formed over a conductive feature. The first interconnect structure is electrically connected to first transistor, and the first cap metal layer is configured to prevent diffusion and cracking of the first conductive feature.

In some embodiments, a semiconductor device is provided. The semiconductor device structure includes a first semiconductor wafer comprising a first transistor formed in a front-side of the first semiconductor wafer and a first bonding layer formed over the first transistor. The semiconductor device structure further includes a second semiconductor wafer including a second transistor formed in a front-side of the second semiconductor wafer, and a backside of the second semiconductor wafer is bonded to the front-side of the first semiconductor wafer. The semiconductor device structure also includes a first interconnect structure formed between the first semiconductor wafer and the second semiconductor wafer, and the first interconnect structure comprises a first cap metal layer formed over a first conductive feature. The first interconnect structure is electrically connected to the first transistor. The semiconductor device structure further includes at least one through substrate via (TSV) extending from the front-side of second semiconductor wafer to the first cap metal layer of the first semiconductor wafer.

In some embodiments, a method for forming a semiconductor device is provided. The method includes providing a first semiconductor wafer, and forming a first transistor and an interconnect structure over a front-side of the first semiconductor wafer, and the interconnect structure comprises a cap metal layer formed over a conductive feature. The method also includes providing a second semiconductor wafer, wherein no devices are formed in the second semiconductor wafer. The method further includes bonding the front-side of the first semiconductor wafer to a backside of the second semiconductor wafer. The method includes thinning a front-side of the second semiconductor wafer, and forming a second transistor in the front-side of the second semiconductor wafer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a first semiconductor wafer comprising a first transistor formed in a front-side of the first semiconductor wafer;
   a second semiconductor wafer comprising a second transistor formed in a front-side of the second semiconductor wafer, wherein a backside of the second semiconductor wafer is bonded to the front-side of the first semiconductor wafer;
   a bonding structure formed between the first semiconductor wafer and the second semiconductor wafer, wherein the bonding structure is made of a dielectric layer, the bonding structure comprising a first dielectric layer adjacent the backside of the second semiconductor wafer and a second dielectric layer interposed between the first dielectric layer and the first semiconductor wafer, the first dielectric layer being bonded to the second dielectric layer;
   a first interconnect structure formed between the first semiconductor wafer and the second semiconductor wafer, the first interconnect structure located directly below the second dielectric layer of the bonding structure, wherein the first interconnect structure comprises a first cap metal layer formed over a first conductive feature, and the first interconnect structure is electrically connected to the first transistor, the first conductive feature extending through a third dielectric layer and into a fourth dielectric layer, the first conductive feature having an upper surface level with an upper surface of the third dielectric layer, the first cap metal layer extending above the upper surface of the third dielectric layer, wherein the first cap metal layer is configured to prevent diffusion and cracking of the first conductive feature; and
   at least one through substrate via (TSV) formed in the second semiconductor wafer, wherein the TSV passes through the first dielectric layer and the second dielectric layer of the bonding structure, ends at the first cap metal layer of the first interconnect structure, and is in direct contact with the first cap metal layer of the first interconnect structure,
   wherein the first interconnect structure is located in direct contact with the second dielectric layer of the bonding structure, and the second dielectric layer of the bonding structure is located in direct contact with the first cap metal layer, the first cap metal layer having a thickness less than a thickness of the second dielectric layer.

2. The semiconductor device structure as claimed in claim 1, wherein the first cap metal layer is made of Ni, NiB, NiWB, Co, CoWB, CoWP, or NiReP.

3. The semiconductor device structure as claimed in claim 1, wherein the first cap metal layer has a thickness in a range from about 5 A to about 700 A.

4. The semiconductor device structure as claimed in claim 1, wherein the first conductive feature is made of copper, copper alloy, aluminum, or aluminum alloys.

5. The semiconductor device structure as claimed in claim 1, wherein the first interconnect structure further comprises:
   a second conductive feature formed below the first conductive feature; and
   a second cap metal layer formed over the second conductive feature.

6. The semiconductor device structure as claimed in claim 1, further comprising:
   a diffusion barrier layer surrounding the first conductive feature.

7. The semiconductor device structure as claimed in claim 1, further comprising:
   a second interconnect structure formed on the second semiconductor wafer.

8. The semiconductor device structure as claimed in claim 7, further comprising:
   the through substrate via (TSV) extending from the second interconnect structure to the first interconnect structure.

9. The semiconductor device structure as claimed in claim 7, wherein the second interconnect structure is electrically connected to the second transistor.

10. A semiconductor device structure, comprising:
    a first semiconductor wafer comprising a first transistor formed in a front-side of the first semiconductor wafer;
    a second semiconductor wafer comprising a second transistor formed in a front-side of the second semiconductor wafer, wherein a backside of the second semiconductor wafer is bonded to the front-side of the first semiconductor wafer;
    a bonding structure formed between the first semiconductor wafer and the second semiconductor wafer, the bonding structure comprising a first dielectric layer adjacent the backside of the second semiconductor wafer and a second dielectric layer interposed between the first dielectric layer and the first semiconductor wafer, the first dielectric layer being bonded to the second dielectric layer;
    a first interconnect structure formed between the first semiconductor wafer and the second semiconductor wafer, the first interconnect structure located directly below the second dielectric layer of the bonding structure, wherein the first interconnect structure comprises a first cap metal layer formed over a first conductive feature, an upper surface of the first conductive feature being level with an upper surface of a third dielectric layer, and the first interconnect structure is electrically connected to the first transistor; and
    at least one through substrate via (TSV) extending from the front-side of the second semiconductor wafer to the first cap metal layer of the first semiconductor wafer, wherein the TSV passes through the first dielectric layer and the second dielectric layer of the bonding structure, ends at the first cap metal layer of the first interconnect structure, and is in direct contact with the first cap metal layer of the first interconnect structure,
    wherein the first interconnect structure is located in direct contact with the bonding structure, and the bonding structure is in direct contact with the first cap metal layer, and the first cap metal layer has a thickness less than a thickness of the second dielectric layer.

11. The semiconductor device structure as claimed in claim 10, wherein the first cap metal layer is made of Ni, NiB, NiWB, Co, Co WB, Co WP, or NiReP.

12. The semiconductor device structure as claimed in claim 10, the first interconnect structure further comprises:
    a second conductive feature formed below the first conductive feature; and
    a second cap metal layer formed over the second conductive feature, wherein the second cap metal layer is electrically connected to the TSV.

13. The semiconductor device structure as claimed in claim 10, wherein the first interconnect structure is electrically connected to the first transistor.

14. The semiconductor device structure as claimed in claim 10, wherein the first cap metal layer has a thickness in a range from about 5 A to about 700 A.

15. The semiconductor device structure as claimed in claim 10, wherein the first conductive feature is made of copper, copper alloy, aluminum, or aluminum alloys.

16. The semiconductor device structure as claimed in claim 10, further comprising:
   a diffusion barrier layer surrounding the first conductive feature.

17. The semiconductor device structure as claimed in claim 10, further comprising:
   a second interconnect structure formed over the front-side of the second semiconductor wafer, wherein the second interconnect structure is electrically connected to the first interconnect structure via the TSV.

18. The semiconductor device structure as claimed in claim 17, wherein the second interconnect structure is electrically connected to the second transistor.

* * * * *